United States Patent [19]

Baliga et al.

[11] Patent Number: 5,338,945
[45] Date of Patent: Aug. 16, 1994

[54] SILICON CARBIDE FIELD EFFECT TRANSISTOR

[75] Inventors: Bantval J. Baliga; Mohit Bhatnagar, both of Raleigh, N.C.

[73] Assignee: North Carolina State University at Raleigh, Raleigh, N.C.

[21] Appl. No.: 196,717

[22] Filed: Feb. 15, 1994

[51] Int. Cl.$^5$ ............... H01L 29/10; H01L 29/161; H01L 29/167
[52] U.S. Cl. ...................... 257/77; 257/335; 257/607; 257/613; 257/66
[58] Field of Search ............... 257/77, 327, 335, 607, 257/609, 613, 65, 66; 437/100

[56] References Cited

U.S. PATENT DOCUMENTS

| | | | |
|---|---|---|---|
| 4,567,502 | 1/1986 | Nakagawa et al. | 357/53 |
| 4,916,507 | 4/1990 | Boudou et al. | 357/51 |
| 4,945,394 | 7/1990 | Palmour et al. | 357/34 |
| 5,032,880 | 7/1991 | Tsunoda | 257/335 |
| 5,087,576 | 2/1992 | Edmond et al. | 437/22 |
| 5,170,231 | 12/1992 | Fujii et al. | 257/77 |

FOREIGN PATENT DOCUMENTS

8904056 5/1989 PCT Int'l Appl. ............ 267/77

OTHER PUBLICATIONS

Trew, Yan and Mock, "The Potential of Diamond and SiC Electronic Devices for Microwave and Millimeter-Wave Power Applications," Proceedings of the IEEE, vol. 79, No. 5, pp. 598–620, May 1991.

Bhatnagar and Baliga, "Analysis of Silicon Carbide Power Device Performance", IEEE, pp. 176–180, 1991.

Pan and Steckl, "Reactive In Etching of SiC Thin Films by Mixtures of Fluorinated Gases and Oxygen", J. Electrochem. Soc., vol. 137, No. 1, pp. 212–220, Jan. 1990.

Davis, "Epitaxial Growth and Doping of and Device Development in Monocrystalline β-SiC Semiconductor Thin Films" Thin Solid Films, vol. 181, pp. Dec. 1–15, 1989.

Shenai, Scott and Baliga, "Optimum Semiconductors for High-Power Electronics,", IEEE Transactions on Electron Devices, vol. 36, No. 9, pp. 1811–1823, Sep., 1989.

Bumgarner, Kong, and Kim, et al., "Monocrystalline β-SiC Semiconductor Thin Films: Epitaxial Growth, Doping, and FET Device Development," 1988 Proceedings of the 38th Electronics Components Conf., pp. 342–349, 1988.

(List continued on next page.)

*Primary Examiner*—Mark V. Prenty
*Attorney, Agent, or Firm*—Bell, Seltzer, Park & Gibson

[57] ABSTRACT

A silicon carbide field effect transistor of the present invention includes a base and source region each formed by a series of amorphizing, implanting and recrystallizing steps. Moreover, the drain, base and source regions extend to a face of a monocrystalline silicon carbide substrate and the source and base regions comprise substantially monocrystalline silicon carbide formed from recrystallized amorphous silicon carbide, The source and base regions also have vertical sidewalls defining the p-n junction between the source/base and base/drain regions, respectively. The vertical orientation of the sidewalls arises from the respective implantation of electrically inactive ions into the substrate during the amorphizing steps for forming the base region in the drain and for forming the source region in the base region. The electrically inactive ions are selected from the group consisting of silicon, hydrogen, neon, helium, carbon and argon. A gate and gate insulating region are also provided on the face of the substrate above the base region. By applying an appropriate turn-on base signal to the gate, a channel is created in the base region. The channel region electrically connects the source to the drain. The source and base are also electrically connected by a source contact on the face, opposite the portion of the base region wherein the channel is formed.

12 Claims, 4 Drawing Sheets

OTHER PUBLICATIONS

Daimon, Yamanaka, Shinohara, Sakuma, Misawa, Endo and Yoshida, "Operation of Schottky-Barrier Field Effect Transistors of 3C-SiC up to 400° C.", Appl. Phys. Lett., vol. 51, pp. 2106–2108, Dec. 1987.

Kelner, Binari, Sleger and Kong, "β-SiC MESFET's and Buried Gate JFET's", IEEE Electron Device Letters, vol. EDL-8, No. 9, pp. 428–430, Sep. 1987.

Kong, Palmour, Glass and Davis, "Temperature Dependence of the Current-Voltage Characteristics, of Metal-Semiconductor . . . Via Chemical Vapor Deposition", Appl. Phys. Lett., vol. 51, pp. 442–444, Aug., 1987.

Kelner, Binari, Sleger and Kong, "β-SiC MESFETs", Mater. Res. Soc. Symp. Proc., vol. 97, p. 227–232, Sep., 1987.

Edmond, Palmour, and Davis, "Chemical Etching of Ion Implanted Amorphous Silicon Carbide," J. Electrochem. Soc.: Solid-State Science and Technology, pp. 650–652, Mar., 1986.

Sugiura, Lu, Cadien and Steckl, "Reactive Etching of SiC Thin Films Using Fluorinated Gases", J. Vac. Sci. Technology. B 4 (1), pp. 349–355, Jan.,–Feb., 1986.

Chang, Fang, Huong, and Wu, "Novel Passivation Dielectrics-The Boron-or Phosphorus-Doped Hydrogenated Amorphous Silicon Carbide Films", J. Electrochem. Soc.: Solid State Science and Technology, pp. 418–422, Feb., 1985.

McHargue, Lewis, Williams and Appleton, "The Reactivity of Ion-Implanted SiC", Materials Science and Engineering, vol. 69, pp. 391–395, 1985.

Palmour, Davis, Astell-Burt and Blackborow, "Effects of Cathode Materials and Gas Species on the Surface Characteristics of Dry Etched Monocrystalline Beta-SiC Thin Films", Silicon Carbide, pp. 491–500.

SILICON CARBIDE FIELD EFFECT TRANSISTOR

This application is a division of application Ser. No. 08/008,747, filed Jan. 25, 1993, now U.S Pat. No. 5,322,802.

CROSS REFERENCE TO RELATED APPLICATIONS

This application is related to application Ser. No. 08/008,719, entitled METHOD OF FORMING TRENCHES IN MONOCRYSTALLINE SILICON CARBIDE application Ser. No. 08/008,203, now U.S. Pat. No. 5,318,915 entitled METHOD FOR FORMING A P-N JUNCTION IN SILICON CARBIDE, AND P-N JUNCTION FORMED THEREBY and application Ser. No. 08/008,766, now U.S. Pat No. 5,270,244 entitled METHOD FOR FORMING AN OXIDE-FILLED TRENCH IN SILICON CARBIDE, all filed concurrently herewith, the disclosures of which are hereby incorporated herein by reference.

FIELD OF THE INVENTION

The present invention relates to microelectronic devices and manufacturing methods, and more particularly to silicon carbide power devices and methods of manufacturing same.

BACKGROUND OF THE INVENTION

The development of semiconductor switching technology for high power applications in motor drive circuits, appliance controls, robotics and lighting ballasts, for example, began with the silicon bipolar junction transistor. As the technology matured, bipolar transistors became capable of handling large current densities in the range of 40–50 A/cm$^2$, with blocking voltages of 600 V.

However, despite the attractive power ratings achieved by bipolar transistors, there exist several fundamental drawbacks to their suitability for all high power applications. First of all, bipolar transistors are current controlled devices. For example, a large control current into the base, typically one fifth to one tenth of the collector current, is required to maintain the device in an operating mode. Even larger base currents, however, are required for high speed forced turn-off. These characteristics make the base drive circuitry complex and expensive. The bipolar transistor is also vulnerable to breakdown if a high current and high voltage are simultaneously applied to the device, as commonly required in inductive power circuit applications. Furthermore, it is difficult to parallel connect these devices since current diversion to a single device occurs at high temperatures, making emitter ballasting schemes necessary.

The silicon power MOSFET was developed to address this base drive problem. In a power MOSFET, a gate electrode bias is applied for turn-on and turn-off control. Turn-on occurs when a conductive channel is formed in the base, between the MOSFET's source and drain regions, under an appropriate gate bias. As will be understood by one-skilled in the art, the length of the channel is dependent on the rate of diffusion of the source and base dopants. The length of the channel is also an important design parameter in power MOSFETs because it has a strong influence on the on-resistance and the transconductance.

The gate electrode is separated from the device's channel by an intervening insulator, typically silicon dioxide. Because the gate is insulated from the channel, little if any gate current is required in either the on-state or off-state. The gate current is also kept small during switching because the gate forms a capacitor with the device's active area. Thus, only charging and discharging current ("displacement current") is required. The high input impedance of the gate, caused by the insulator, is a primary feature of the power MOSFET. Moreover, because of the minimal current demands on the gate, the gate drive circuitry can be easily implemented on a single chip. As compared to silicon bipolar technology, the simple gate control provides for a large reduction in cost and a significant improvement in reliability. An example of a known power MOSFET is the DMOS structure, illustrated at FIG. 1, and described in a textbook by coinventor Baliga, entitled *Modern Power Devices* (1987), p 265.

Power MOSFETs of the type herein described have typically been formed in silicon. However, because of the physical, thermal and electrical properties of silicon carbide, it is believed that power MOSFETs formed of silicon carbide may provide significant performance advantages over silicon power MOSFETs. This is because silicon carbide has a wide bandgap (2.2 eV at 300K) a high melting point (3103K, 30 atms), a small dielectric constant (9.3), a high breakdown field strength ($2.5 \times 10^6$ V/cm), a high thermal conductivity (1.5 W/cm-° C.) and a high saturated electron drift velocity ($2 \times 10^7$ cm/sec.) compared to silicon, which is the most commonly used semiconductor material. These characteristics allow silicon carbide microelectronic devices to operate at higher temperatures and higher power levels than conventional silicon based devices.

In addition to the above advantages, silicon carbide power devices can operate with lower specific on-resistance than conventional silicon power devices. Some of the advantages of using silicon carbide for forming power semiconductor devices are described in articles by K. Shenai, R. S. Scott, and coinventor B. J. Baliga, entitled *Optimum Semiconductors for High-Power Electronics*, IEEE Transactions on Electron Devices, Vol. 36, No. 9, pp. 1811–1823 (1989); and by coinventors M. Bhatnagar and B. J. Baliga entitled *Analysis of Silicon Carbide Power Device Performance*, ISPSD '91, Abstr. 8.3, pp 176–180 (1991).

The process for manufacturing the silicon based DMOSFET device of FIG. 1 includes diffusing the P-base and N+ source regions into the substrate. For silicon, it is possible to obtain P-N junctions well beneath the surface of the substrate using diffusion, since diffusion rates for dopants in silicon are relatively high even at relatively low temperatures on the order of 1000–1200 degrees Centigrade. It is therefore possible to obtain P-N junctions in silicon as deep as 1–3 microns.

The ability to obtain deep junctions in silicon is an important feature in the design of power MOSFETs and, in particular, is a factor in determining the forward blocking capability and punch-through breakdown condition. For example, as will be understood by one skilled in the art, despite the short-circuiting of the N+ emitter to the P-base, via the source contact as shown in FIG. 1, the DMOSFET will conduct current under reverse bias as soon as the depletion layer in the P-base punches through to the N+ emitter and the N+ emitter begins injecting electrons into the P-base region. Because of the opportunity for punch-through, the shape of the doping profiles in the P-base and N+ emitter and the respective doping concentrations are important design considerations. A typical diffusion profile for the DMOSFET of FIG. 1 is shown in FIG. 2. The solid lines indicate the doping distributions, whereas the dashed lines show the resulting carrier concentration profiles, which differ from the dopant profiles as a result of compensation effects. The surface concentration $N_{SP}$ of the P-base diffusion and the N+ emitter depth combine to determine the peak doping $N_{AP}$ in the P-base as indicated by the arrow. The depths of the P-base and N+ -emitter diffusions are respectively denoted as $X_P$ and $X_{N+}$.

In addition to the above-mentioned design considerations including peak dopant concentration and profile, the channel length "L" between the edge of the source and drain regions beneath the gate is also important because it has a strong influence on the on-resistance of the device and the device's transconductance. Moreover, because of the need to maintain a low peak P-base concentration and a short channel length to achieve good on-state characteristics, conventional techniques for raising the punch-through threshold generally restrict the ability to obtain preferred on-state characteristics unless other steps can be taken to limit the peak concentration in the P-base region and simultaneously provide sufficient resident charge to prevent punch-through to the N+ emitter. With respect to FIG. 2, this would include steps to limit the peak concentrations in each region while also maintaining the total area under the respective curve for each region at the same value. To achieve this, more uniform doping profiles that extend as far into the substrate as the diffused profiles would be required.

In contrast to silicon, the diffusion coefficients of conventional P and N-type dopants in silicon carbide are small in the temperature range of 1000–1200 degrees Centigrade. In fact, temperatures on the order of 1500 degrees Centigrade and higher are generally required for diffusion to occur at appreciable rates. For example, in an invited paper by R. J. Trew, J. B. Yan and P. M. Mock, entitled *The Potential of Diamond and SiC Electronic Devices for Microwave and Millimeter-Wave Power Applications*, Proc. of the IEEE, Vol. 79, No. 5, pp. 598–620 (1991), temperatures on the order of 1900 degrees Centigrade were specified as being required for the diffusion of N or P-type dopants in silicon carbide. Unfortunately, this extreme range of temperatures is not compatible with the fabrication of integrated semiconductor devices having multiple layers of different conductivity type material. These temperatures are also considerably above the melting point of $SiO_2$, a diffusion masking material having no commercially acceptable alternative for high temperature processing. Given these limitations, it is generally accepted that P-N junction formation arising from epitaxial growth or ion implantation with boron (B) or aluminum (Al) (p-type) or phosphorus (P) or nitrogen (N) (n-type) is most suitable for silicon carbide.

Unfortunately, although there has been a general acceptance of ion-implantation as a technique for forming P-N junctions in silicon carbide, problems including out-diffusion of dopant species, the precipitation of defect clusters, and the formation of electrically active line and point defects causing poor dopant ionization are encountered in the formation of lateral MESFETs and MOSFETs. For example, in an article by J. W. Bumgarner, H. S. Kong, H. J. Kim, J. W. Palmour, J. A. Edmond, J. T. Glass, and R. F. Davis, entitled *Monocrystalline β-SiC Semiconductor Thin Films: Epitaxial Growth, Doping and FET Device Development*, 1988 Proc. 38th Electronics Components Conf., pp. 342–349, solid phase epitaxial re-growth of the amorphous regions caused by the implantation of boron was achieved by annealing at 1600 degrees Centigrade for 300 seconds. However, defect clusters of precipitates and vacancy loops formed near the center of the amorphous regions within the implanted region. Subsequent annealing at 1800 degrees Centigrade for 300 seconds promoted virtually defect free regrowth, but SIMS analysis revealed almost complete out-diffusion of the implanted boron ions.

The implantation of P or N-type dopant species also results in the formation of an implant profile having a peak concentration below the implant surface. As well understood by those skilled in the art, the implant profile can generally be approximated by a Gaussian curve, or for greater accuracy, a four-moment Pearson-IV curve. However, even after annealing, which may cause diffusion away from the peak concentration region, a non-uniform doping profile in the N or P-type region is present. Accordingly, it is difficult to achieve a great degree of uniformity in regions formed by ion implantation.

Thus, while ion-implantation may be used as a technique for forming regions of P and N-type conductivity in silicon carbide, it would be preferable to manufacture silicon carbide power MOSFETS that have more uniform deep-diffused junctions than obtainable using ion-implantation techniques alone.

SUMMARY OF THE INVENTION

It is therefore an object of the present invention to provide a field effect transistor formed in a monocrystalline silicon carbide substrate and improved method for fabricating same.

It is another object of the present invention to provide a method for forming a silicon carbide field effect transistor having uniformly doped drain, source and base regions.

These and other objects are provided, according to the present invention, by a silicon carbide field effect transistor having a base region and a source region each formed by a series of amorphizing, implanting and recrystallizing steps. In particular, the base region of the silicon carbide field effect transistor is formed by amorphizing a first portion of a silicon carbide substrate, providing an implant of the base region dopant ions into the first portion and then recrystallizing the first portion to thereby create a substantially monocrystalline base region. Next, the source region is formed by amorphizing a second portion of the substantially monocrystalline base region, providing an implant of the source region dopant ions and then recrystallizing the second portion to thereby create a substantially monocrystalline source region in the base region.

The field effect transistor formed by the above mentioned steps comprises a monocrystalline silicon carbide drain region of first conductivity type, a substantially monocrystalline silicon carbide base region of second conductivity type in the drain region and a substantially monocrystalline silicon carbide source region of first conductivity type in the base region. The source, base and drain regions extend to a face of a monocrystalline silicon carbide substrate. In addition, unlike the DMOS structure of the prior art, the base and source regions of the present invention have vertical sidewalls defining the P-N junctions between the source/base and base/drain regions. The vertical orientation of the sidewalls arises from the respective implantation of the electrically inactive ions into the substrate during the amorphizing steps for forming the base region in the drain and for forming the source region in the base region.

As will be understood by one skilled in the art, when the respective dopant ions are implanted and uniformly diffused into the corresponding amorphized base and source regions, the vertical sidewalls are retained. This is because the diffusion rate of the dopant ions in the adjacent monocrystalline silicon carbide regions is substantially less than the diffusion rate of the dopant ions in the amorphized regions. Accordingly, a uniform distribution of the dopant ions can be achieved in the amorphized regions before any appreciable ion diffusion out of the amorphized region occurs.

In particular, the step for amorphizing a first portion of the substrate or for amorphizing a second portion of the first substantially monocrystalline region can be described as a series of steps. Each amorphizing step comprises the steps of implanting electrically inactive ions into portions of the substrate wherein the respective base and source regions are to be formed, such that the implanted electrically inactive ions convert the portions into regions of amorphous silicon carbide. As will be understood by one skilled in the art, the implantation of the electrically inactive ions will cause the resulting amorphous silicon carbide region to have a substantially rectangular shape characterized by a bottom edge and sidewall extending from the bottom edge to the face. The bottom edge is beneath the face at a distance determined by the implantation of electrically inactive ions step. The implantation energy, weight of the implanted ions, and implant offset angle measured from a perpendicular line extending from the face generally control the depth of the respective amorphous region. Furthermore, due to the physics of ion implantation, the sidewall and bottom edges for the respective base and source regions are substantially orthogonal to each other and the sidewall extends from the bottom edge to the face.

The step for implanting electrically inactive ions preferably comprises the steps of first masking an area on the face of the substrate corresponding to the portion (base or source) to be formed and then directing electrically inactive ions to the face, such that the electrically inactive ions implant into the substrate in the region defined by the respective masked area. The electrically inactive ions are preferably selected from the group consisting of silicon, hydrogen, neon, helium, carbon and argon.

Following each of the respective amorphizing steps, a relatively shallow dopant implant step is performed to provide the first and second conductivity type ions to the amorphized source and base regions, respectively. Because the dopant implanted regions have already been amorphized, subsequent processing can be used to drive-in the dopants and uniformly distribute the dopants in the amorphized region. In a preferred embodiment, each of the dopant ion implanting steps is followed by the step of annealing the substrate to thereby drive-in and uniformly distribute the implanted dopant ions in the generally rectangular shaped amorphized regions. This annealing step preferably takes the form of a separate and independent step, but may also occur during the recrystallizing step that follows the respective dopant ion implantation step for forming the base and source regions.

According to another aspect of the invention, means is also provided at the face, between the drain and the source regions, for modulating the conductivity of the base region at the face and for electrically connecting the source region to the drain region in response to a turn-on bias signal. The modulating means performs the function of electrically connecting the substantially monocrystalline source region to the monocrystalline drain region (substrate) in response to a turn-on bias signal. The electrical connection is preferably provided by a conductive channel in the base region. The means for modulating the electrical conductivity of the base region and for electrically connecting the source region to the drain region preferably comprises an insulating means such as an oxide on the base region and conducting means such as a gate electrode on the insulating means, opposite the base region. As will be understood by one skilled in the art, the method for forming the modulating means can comprise the steps of forming an insulating region on the face, above the substantially monocrystalline silicon carbide base region and depositing a gate conductive layer on the insulating region, opposite the base region. A source contact, electrically connecting the base region to the source region, is also provided on the face.

Thus, according to the present invention, a silicon carbide field effect transistor having vertically walled and substantially monocrystalline source and base regions can be formed by a series of steps. The steps include an amorphizing step comprising the step of implanting electrically inactive ions to thereby define the generally rectangular shape of the base and source regions and a dopant ion implanting step for providing an implant of the dopant ions of first and second conductivity type into the respective source and base regions. Separate recrystallizing steps for recrystallizing the base region after the base region dopant implanting step and recrystallizing the source region after the source region dopant implanting step are also performed to obtain substantially monocrystalline base and source regions.

DESCRIPTION OF THE PREFERRED EMBODIMENTS

Figure 1:
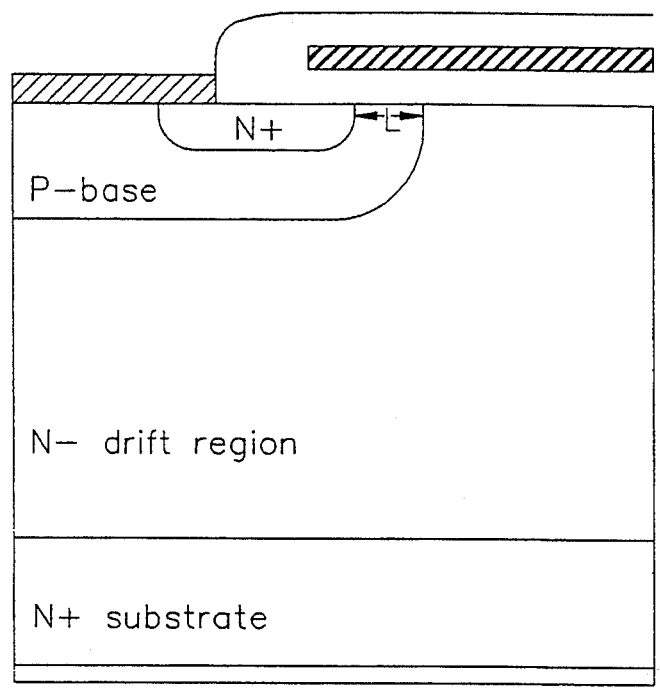
FIG. 1 illustrates a cross-sectional representation of a prior art silicon power MOSFET.
Figure 2:
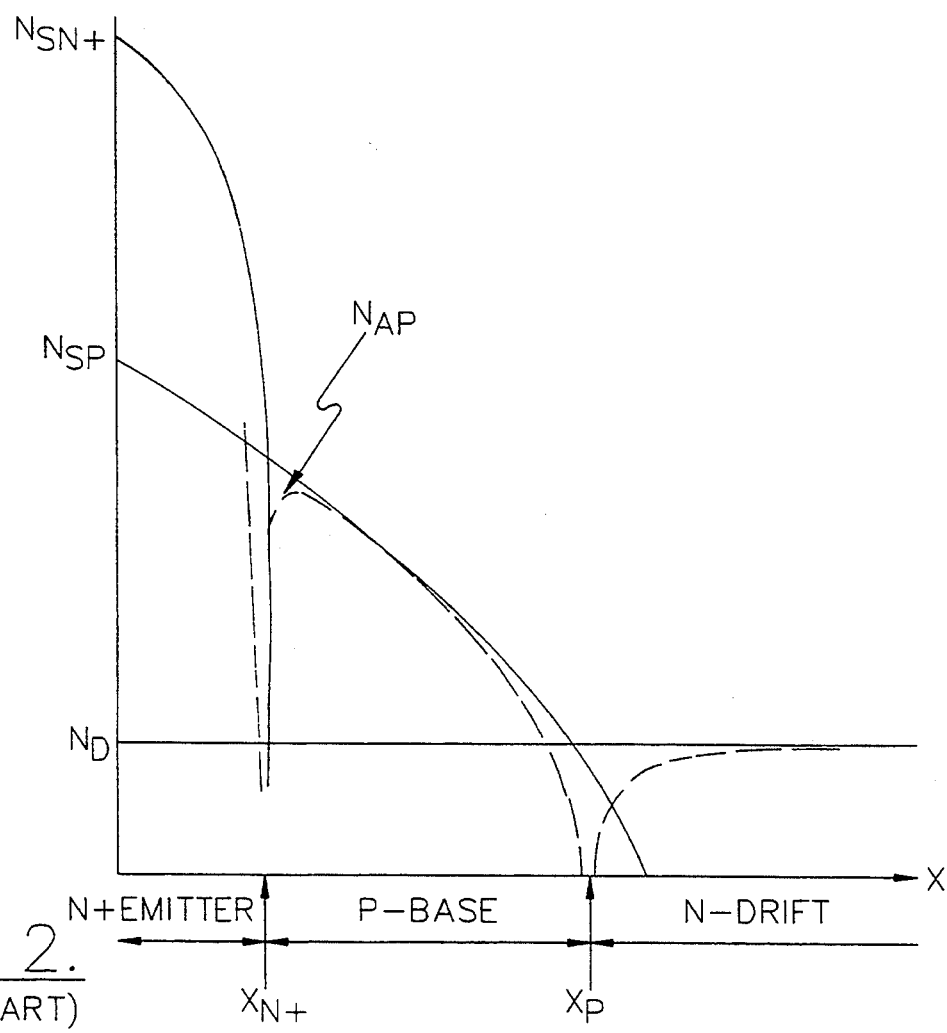
FIG. 2 illustrates the emitter, base and drift layer doping profiles for the silicon power MOSFET shown in FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3A:
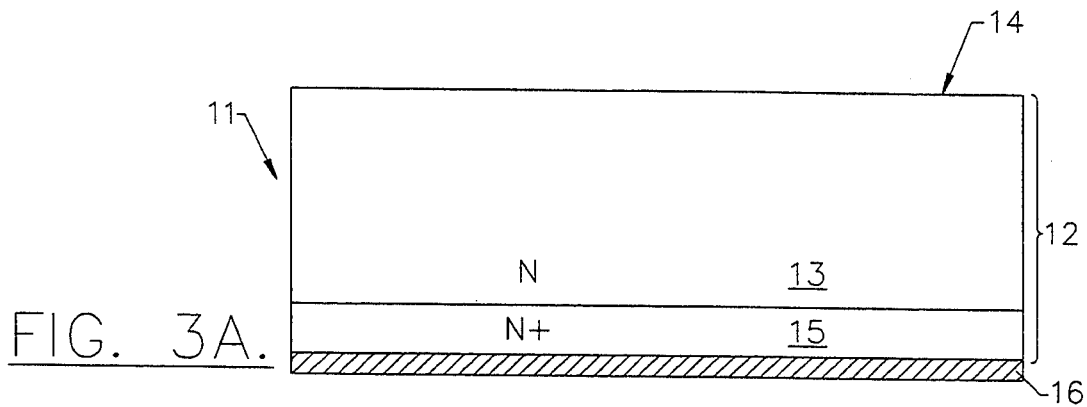
FIGS. 3A–3G are cross-sectional side views of a monocrystalline silicon carbide substrate during intermediate processing steps for forming a silicon carbide field effect transistor therein according to the present invention.

Referring now to FIGS. 1A–1G, a method for forming a silicon carbide field effect transistor according to the present invention will now be described. As shown in FIG. 3A, a monocrystalline silicon carbide substrate 11 is provided. The substrate 11 is of first conductivity type. For an N-channel field effect transistor according to the present invention, the substrate 11 preferably includes a drain region 12 comprising an N-type region 13 on an N+ region 15. The drain region 12 extends to a face 14 of the substrate 11. A drain contact metallization layer 16 is also preferably applied to the N+ region 15. The metallization layer 16 may also be applied at the back end of the process, after the transistor is formed. The steps for forming a silicon carbide substrate 11 including the drain region 12, as herein described, are well known to the art and need not be further described herein.

Figure 3B:
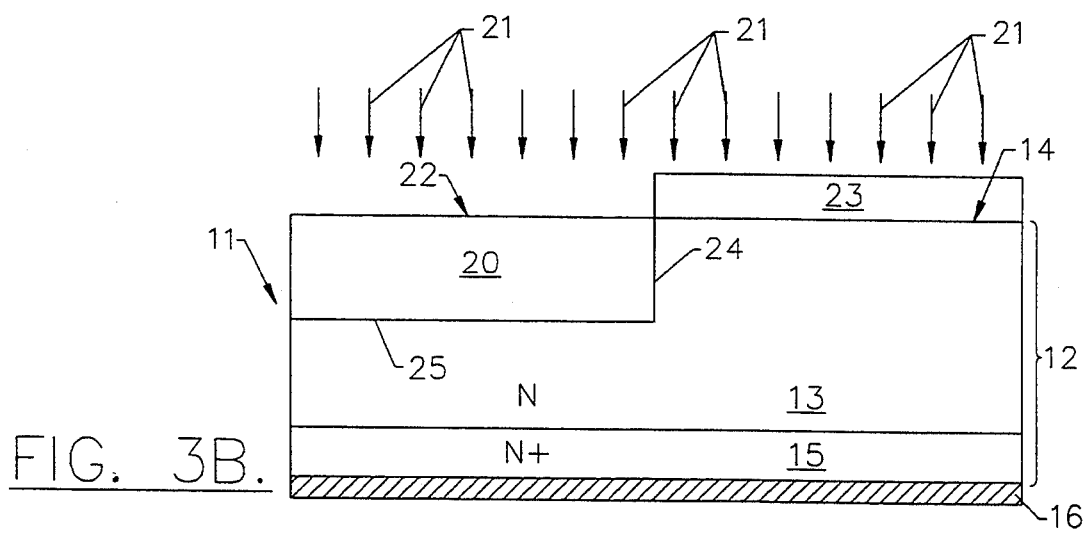

As shown in FIG. 3B, a first amorphizing step is performed to define a first amorphous silicon carbide region 20 in the monocrystalline silicon carbide substrate 11. This step comprises the step of implanting ions 21 into a first portion 22 of the substrate 11 corresponding to the first amorphized region 20 to be formed. The ion implanting step includes the steps of masking a first area on the face 14 using a mask 23. Ions 21 are then directed to the face, such that the ions 21 implant into the substrate 11 in the region 22 defined by the first masked area. Because of the implantation of ions 21, a first amorphous silicon carbide region 20 having a bottom edge 25 and a sidewall 24, extending substantially orthogonal from the edge 25 to the face 14, is created.

Preferably, the ions 21 implanted during the amorphizing step are electrically inactive, with respect to silicon carbide. The TABLE below illustrates some of the electrically inactive ions which can be used, and the dose required to produce the desired depth of the first amorphized region 20 at 200 keV energy. It will be understood by those having skill in the art that lighter ions such as hydrogen typically penetrate the substrate to a greater depth than heavier ions such as argon, for a given implant dose. Multiple implants at different energies may also be used in order to obtain a uniform amorphous region having the desired depth.

| Implanted Ion | Depth of Amorphous Region (Å) | Dose (cm$^{-2}$) |
| --- | --- | --- |
| Ar++ | 5000 | 6E14 |
| Ar+ | 2100 | 4.8E14 |
| C+ | 6000 | 7E15 |
| He+ | 9000 | 1E17 |
| Si+ | 2800 | 8E14 |
| H+ | 15,000 | 2E18 |
| Ne+ | 4000 | 2E15 |

Figure 3C:
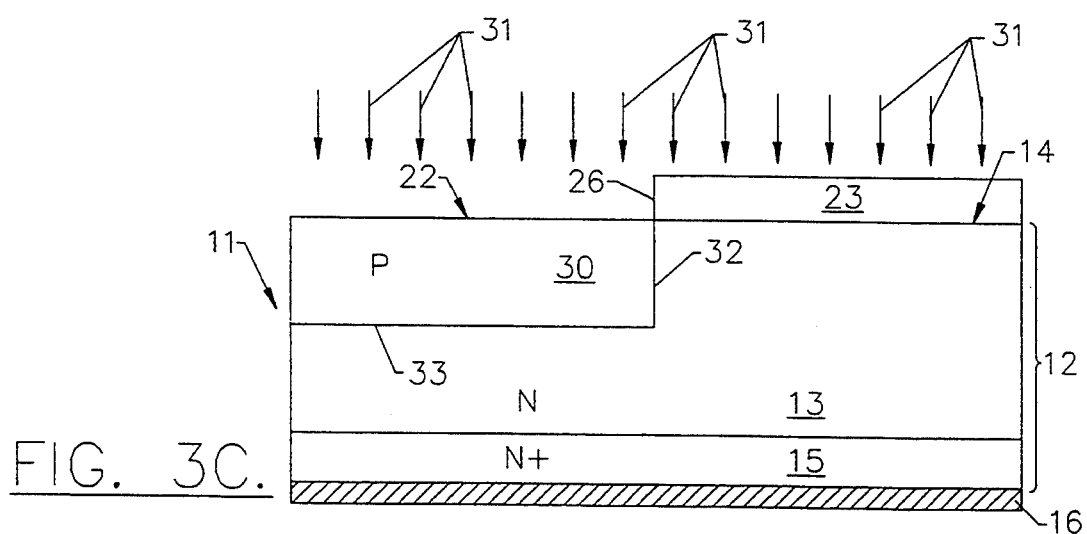

Referring now to FIG. 3C, the first amorphizing step is followed by the step of implanting dopant ions 31 of second conductivity type into the surface of the first amorphous region 20. Thereafter, the first amorphous region 20 is recrystallized preferably by solid phase epitaxy to form a first substantially monocrystalline region 30 of second conductivity type having a respective bottom edge 33 and sidewall 32 corresponding to bottom edge 25 and sidewall 24, shown in FIG. 3B. The region 30 of second conductivity type corresponds to the base region of the field effect transistor to be formed. This recrystallization step may be performed simultaneously with or preceded by an annealing step to drive-in and uniformly distribute the implanted dopant ions 31 of second conductivity type in the first amorphous region 20. As will be understood by one skilled in the art, the recrystallization step may be assisted by such conventional techniques as rapid thermal annealing and laser-assisted heating.

Figure 3D:
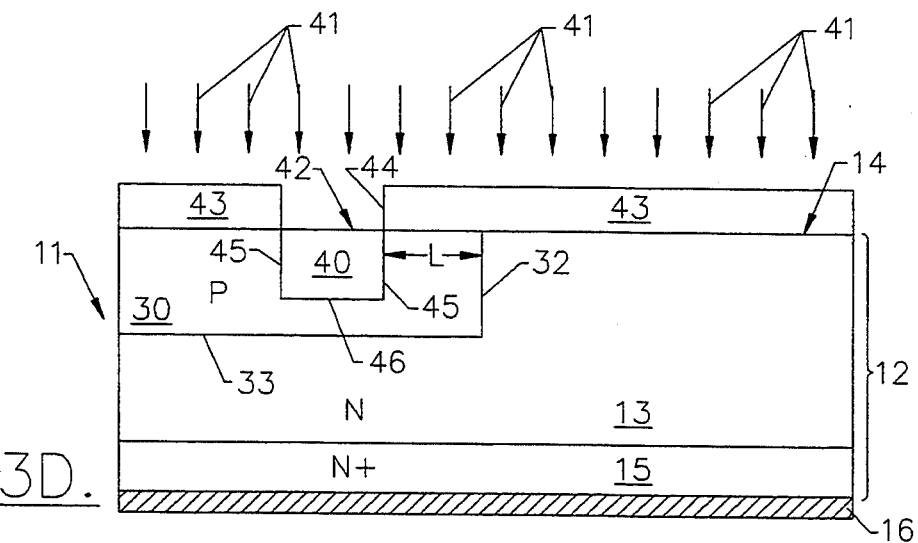

Referring now to FIG. 3D, a second amorphizing step is performed to define a second amorphous silicon carbide region 40 in the monocrystalline silicon carbide substrate 11. This step comprises the step of implanting ions 41 into a second portion 42 of the substrate 11 corresponding to the second amorphized region 40 to be formed. The ion implanting step includes the steps of masking a second area on the face 14 using a mask 43. As will be understood by one skilled in the art, the mask 43 is patterned so that the edge 44 of mask 43 is offset from the sidewall 32 of the base region 30 by a distance L corresponding to the channel length of the field effect transistor to be formed. Subsequent to the step for masking a second area, ions 41 are directed to the face 14, such that the ions 41 implant into the substrate 11 in the region 42 defined by the second masked area. Because of the implantation of ions 41, a second amorphous silicon carbide region 40 having a bottom edge 46 and sidewalls 45, extending substantially orthogonal from the edge 46 to the face 14, is created. Preferably, the ions 41 implanted during the amorphizing step are electrically inactive, with respect to silicon carbide. The ions 41 may be selected from the group consisting of silicon, hydrogen, neon, helium, carbon and argon.

As will be understood by one skilled in the art, the separate step for patterning the mask 43, so as to define the length of the channel L, may be omitted if the first masking step is modified. For example, if the mask 23 for defining the first area comprises polycrystalline silicon, a sidewall spacer region may be formed on the face 14, adjacent the edge 26 shown in FIG. 3C, to thereby define the length of the channel L. Accordingly, during the implant step for defining the position of the second amorphous silicon carbide region 40, the sidewall spacer region will act as a mask. This technique for offsetting region 40 with respect to the base 30 is conventional and similar to the techniques frequently used in MOS technology for forming self-aligned gates.

Figure 3E:
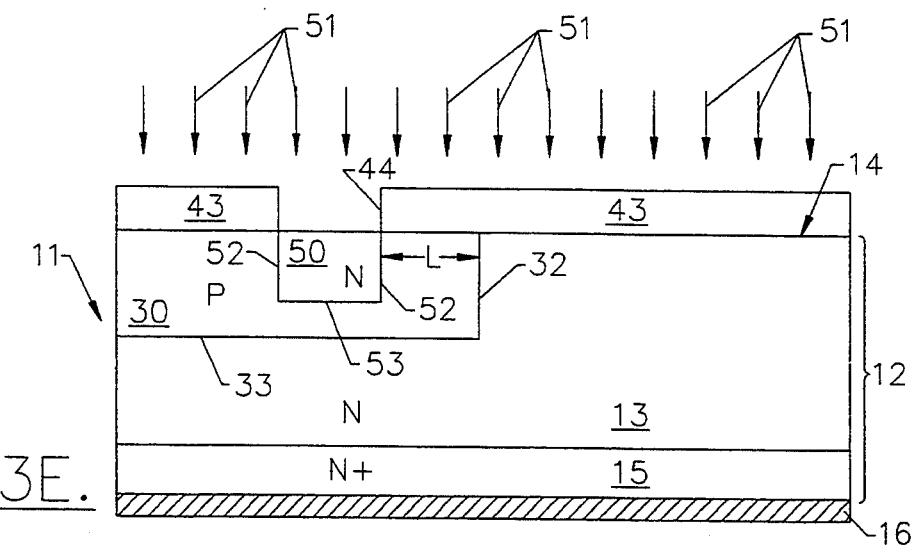

Referring now to FIG. 3E, the second amorphizing step is followed by the step of implanting dopant ions 51 of second conductivity type into the surface of the second amorphous region 40. Thereafter, the second amorphous region 40 is recrystallized preferably by solid phase epitaxy to form a second substantially monocrystalline region 50 of second conductivity type having a respective bottom edge 53 and sidewalls 52 corresponding to bottom edge 46 and sidewalls 45. The region 50 corresponds to the source region of the field effect transistor to be formed. Like the previous recrystallizing step for forming the base region 30, the recrystallizing step for forming the source region may be performed simultaneously with or preceded by an annealing step to drive-in and uniformly distribute the implanted dopant ions 51 of second conductivity type in the second amorphous region 40.

Figure 3F:
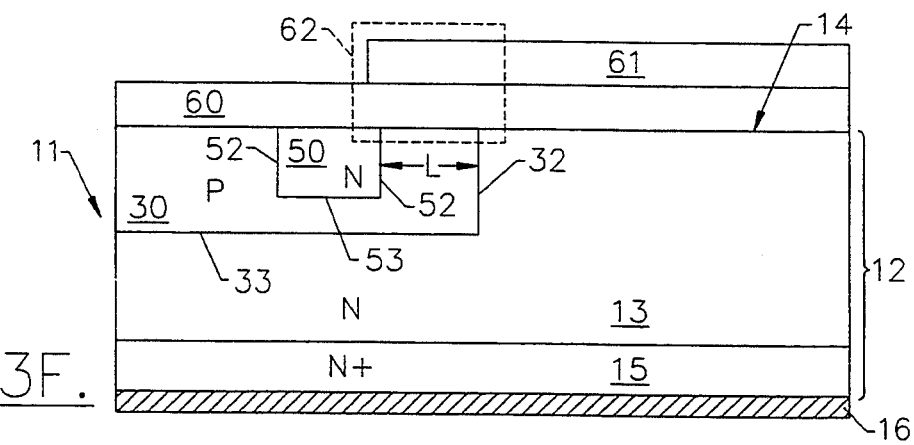

Referring now to FIG. 3F, after the base region 30 and source region 50 have been formed, an insulating region 60, such as $SiO_2$, is formed on the face 14. The insulating region 60 may be formed using thermal oxidation or other conventional techniques. A gate conductive layer 61, such as polycrystalline silicon, can then be deposited and patterned on the insulating region 60 using conventional techniques. Because the gate conductive layer 61 comprises the gate electrode for the field effect transistor, it is patterned above the base region 30 and overlaps a portion of the source region 50 and drain region 12, near sidewalls 52, 32, respectively. The portion of the base region 30 between the sidewalls 32 and 52 comprises the active region of the field effect transistor wherein the conductive channel is formed to thereby connect the source region 50 to the drain region 12 in response to a turn-on bias signal. As will be understood by one skilled in the art, the combination of the gate conductive layer 61 on the insulating region 60 comprises a preferred means 62 for modulating the conductivity of the underlying base region 30 and for electrically connecting the source region 50 to the drain region 12.

Figure 3G:
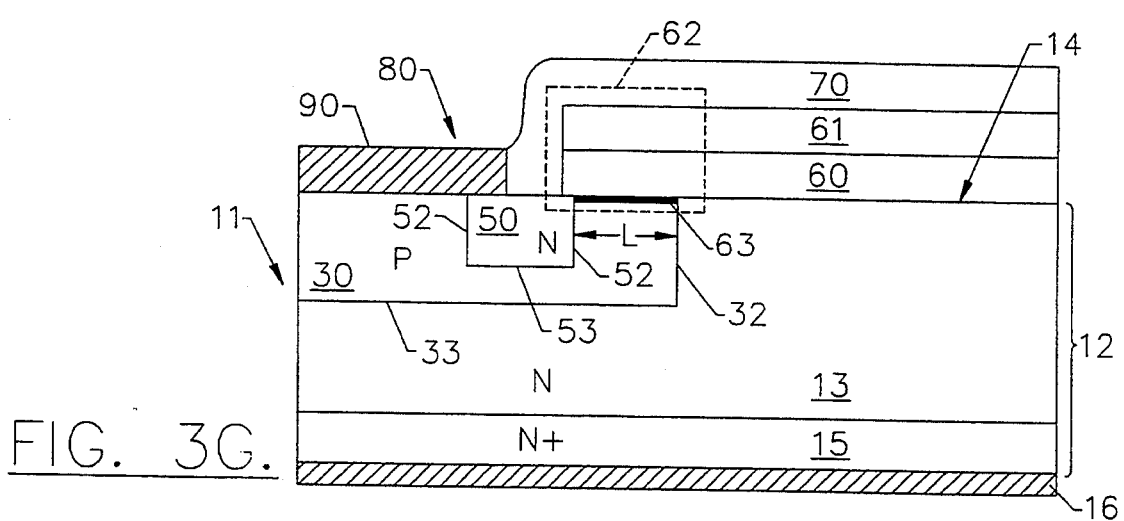

Referring now to FIG. 3G, the gate conductive layer 61 is preferably covered by an insulating region 70 using conventional techniques. The insulating region 70 is patterned to thereby provide an contact window 80 to the base region 30 and source region 50 at the face 14. The contact metal 90, for providing contact to the source region 50 and electrically connecting the source region 50 to the base region 30, is then deposited using conventional techniques.

According to the above described method for forming a silicon carbide field effect transistor, a silicon carbide field effect transistor can be obtained having a monocrystalline silicon carbide drain region 12 of first conductivity type; a silicon carbide base region 30 of second conductivity type in the drain region 12; and a silicon carbide source region 50 of first conductivity type in the base region 30. A source contact 90 on the face 14 is also provided and electrically contacts the source region 50 and the base region 30. The means 62 for modulating the electrical conductivity of the base region 30 and for electrically connecting the source region 50 to the drain region 12 is also preferably provided by the gate insulating region 60 on the face 14 and a gate conductive layer 61 (gate electrode) on the insulating region 60. The gate conductive layer 61 provides for the gated control of an inversion layer channel 63 in the base region 30, in response to a turn-on bias signal being applied thereto.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A silicon carbide field effect transistor comprising:
    a monocrystalline silicon carbide drain region having dopant ions of first conductivity type therein;
    a silicon carbide base region in said monocrystalline drain region, said base region forming a P-N junction with said monocrystalline drain region and having uniformly distributed dopant ions of second conductivity type and uniformly distributed electrically inactive ions therein; and
    a silicon carbide source region in said base region, said source region forming a P-N junction with said base region and having uniformly distributed dopant ions of first conductivity type and uniformly distributed electrically inactive ion therein.

2. The silicon carbide field effect transistor of claim 1, further comprising means between said monocrystalline drain region and said source region for modulating the electrical conductivity of said base region to thereby connect said source region to said monocrystalline drain region in response to a turn-on bias signal.

3. The silicon carbide field effect transistor of claim 1, wherein said electrically inactive ions are selected from the group consisting of silicon, hydrogen, neon, helium, carbon and argon.

4. The silicon carbide field effect transistor of claim 2, wherein said electrical conductivity modulating means comprises an insulated-gate field effect transistor.

5. A silicon carbide field effect transistor comprising:
    a monocrystalline silicon carbide drain region of first conductivity type;
    a silicon carbide base region in said monocrystalline drain region and extending to a face thereof, said base region having uniformly distributed dopant ions of second conductivity type therein and a base bottom and base sidewall, said base bottom defining a base bottom edge and said base sidewall extending substantially orthogonal from said base bottom edge to the face;
    a silicon carbide source region in said base region and extending to the face, said source region having uniformly distributed dopant ions of first conductivity type therein and a source bottom and a source sidewall, said source bottom defining a source bottom edge and said source sidewall extending substantially orthogonal from said source bottom edge to the face; and
    uniformly distributed electrically inactive ions in said silicon carbide base region and said silicon carbide source region.

6. The silicon carbide field effect transistor of claim 5, further comprising means between said monocrystalline drain region and said source region for modulating the electrical conductivity of said base region to thereby connect said source region to said monocrystalline drain region in response to a turn-on bias signal.

7. The silicon carbide field effect transistor of claim 6, wherein said electrical conductivity modulating means comprises an insulated-gate field effect transistor.

8. A silicon carbide field effect transistor comprising:
    a monocrystalline silicon carbide drain region of first conductivity type;
    a recrystallized silicon carbide base region in said monocrystalline drain region, said recrystallized base region forming a P-N junction with said monocrystalline drain region and having dopant ions of second conductivity type and electrically inactive ions, selected from the group consisting of silicon, hydrogen, neon, helium, carbon and argon, therein; and
    a recrystallized silicon carbide source region in said recrystallized base region, said recrystallized source region forming a P-N junction with said recrystallized base region and having dopant ions of first conductivity type and said electrically inactive ions therein.

9. The silicon carbide field effect transistor of claim 8, further comprising means between said monocrystalline drain region and said recrystallized source region for modulating the electrical conductivity of said recrystallized base region to thereby connect said recrystallized source region to said monocrystalline drain region in response to a turn-on bias signal.

10. The silicon carbide field effect transistor of claim 8, wherein said dopant ions of second conductivity type and said electrically inactive ions are uniformly distributed in said base region.

11. The silicon carbide field effect transistor of claim 9, wherein said electrical conductivity modulating means comprises an insulated-gate field effect transistor.

12. The silicon carbide field effect transistor of claim 10, wherein said dopant ions of first conductivity type and said electrically inactive ions are uniformly distributed in said source region.

* * * * *

UNITED STATES PATENT AND TRADEMARK OFFICE
CERTIFICATE OF CORRECTION

PATENT NO. : 5,338,945
DATED : August 16, 1994
INVENTOR(S) : Baliga et al.

It is certified that error appears in the above-identified patent and that said Letters Patent is hereby corrected as shown below:

On the title page,

BEFORE "REFERENCES CITED":

Please add:

Related U.S. Application:

Division of Serial No. 08/008,747, January 25, 1993, now U.S. Patent No. 5,322,802

UNDER "OTHER PUBLICATIONS":

Column 1, line 7, "In" should be -- Ion --.

IN THE ABSTRACT:

Column 2, line 8, after "carbide" the comma (,) should be a period (.).

Column 2, line 20, "base" should be -- bias --.

Column 1, line 13, after "CARBIDE" insert a semicolon (;).

Column 1, line 63, "one-skilled" should be -- one skilled --.

Column 3, line 59, "A1" should be -- Al --.

Column 7, line 5, "1A-1G" should be -- 3A-3G --.

UNITED STATES PATENT AND TRADEMARK OFFICE
CERTIFICATE OF CORRECTION

PATENT NO. : 5,338,945
DATED : August 16, 1994
INVENTOR(S) : Baliga et al.

It is certified that error appears in the above-identified patent and that said Letters Patent is hereby corrected as shown below:

<u>IN THE CLAIMS</u>:

Column 10, line 2, "ion" should be -- ions --.

Column 10, line 23, after "and" insert -- a --.

Signed and Sealed this

Twenty-fifth Day of October, 1994

Attest:

BRUCE LEHMAN

Attesting Officer        Commissioner of Patents and Trademarks